United States Patent
Tsurumi et al.

(10) Patent No.: US 7,456,707 B2
(45) Date of Patent: Nov. 25, 2008

(54) RESONATOR AND FILTER USING THE SAME

(75) Inventors: Naohiro Tsurumi, Kyoto (JP); Kazuhiro Yahata, Osaka (JP); Yasuhiro Uemoto, Shiga (JP); Tsuyoshi Tanaka, Osaka (JP); Daisuke Ueda, Osaka (JP); Atsuhiko Kanda, Hyogo (JP)

(73) Assignee: Panasonic Corporation, Osaka (JP)

( * ) Notice: Subject to any disclaimer, the term of this patent is extended or adjusted under 35 U.S.C. 154(b) by 514 days.

(21) Appl. No.: 11/194,460

(22) Filed: Aug. 2, 2005

(65) Prior Publication Data

US 2006/0038636 A1 Feb. 23, 2006

(30) Foreign Application Priority Data

Aug. 18, 2004 (JP) .............................. 2004-238398

(51) Int. Cl.
*H03H 9/54* (2006.01)
(52) U.S. Cl. ..................... 333/187; 333/189; 333/191; 310/324
(58) Field of Classification Search ................. 333/191; 310/349
See application file for complete search history.

(56) References Cited

U.S. PATENT DOCUMENTS

| | | | |
|---|---|---|---|
| 5,162,691 A * | 11/1992 | Mariani et al. ............. | 310/321 |
| 6,384,697 B1 | 5/2002 | Ruby | |
| 6,635,519 B2 * | 10/2003 | Barber et al. ............... | 438/151 |
| 7,038,559 B2 * | 5/2006 | Ruby et al. ................. | 333/189 |
| 7,095,298 B2 * | 8/2006 | Song et al. .................. | 333/187 |
| 7,227,433 B2 * | 6/2007 | Ginsburg et al. ............ | 333/187 |
| 2007/0085633 A1 * | 4/2007 | Nakatsuka et al. .......... | 333/187 |

FOREIGN PATENT DOCUMENTS

| | | |
|---|---|---|
| JP | 09-064675 | 3/1997 |
| WO | WO 98/16956 | 4/1998 |

\* cited by examiner

*Primary Examiner*—Benny Lee
*Assistant Examiner*—Alan Wong
(74) *Attorney, Agent, or Firm*—McDermott Will & Emery LLP (57) ABSTRACT

An acoustic resonator includes: a substrate; a resonator film which is supported above the main surface of the substrate and includes a piezoelectric film and a pair of a top electrode and a bottom electrode which are formed on part of the top surface and part of the bottom surface of the piezoelectric film, respectively, to face each other via the piezoelectric film; and a support which is formed on the main surface of the substrate to support the resonator film from below. A resonance cavity is provided in part of a region between the substrate and the resonator film below at least a portion of part of the resonator film where the top electrode and the bottom electrode coincide with each other and an isolation cavity is provided in other part of said region where the support and the resonance cavity do not exist.

18 Claims, 8 Drawing Sheets

RESONATOR AND FILTER USING THE SAME

CROSS-REFERENCE TO RELATED APPLICATION

This non-provisional application claims priority under 35 U.S.C. §119(a) on Patent Application No. 2004-238398 filed in Japan on Aug. 18, 2004, the entire contents of which are hereby incorporated by reference.

BACKGROUND OF THE INVENTION (a) Field of the Invention

The present invention relates to an acoustic resonator and a filter. In particular, it relates to a thin film bulk acoustic resonator and a filter for use in an electronic circuit.

(b) Description of Related Art

Aiming at improvement in performance and reduction in cost and size of electronic devices, there are growing demands for high frequency signal filters of small size and high performance. On electronic products for consumer use that make use of high frequency signals, such as cellular phones, severe limitations have been imposed in terms of cost. Further, since a signal of a certain frequency must be selected accurately among input high-frequency signals, precise filters have been required. In such conditions, research and development have persistently been carried out to realize an inexpensive and simple filter unit.

Nowadays, attention has been paid to a filter using a thin film bulk acoustic resonator (FBAR) as an example of possible filters that meet the above-described requirements. The FBAR is an acoustic resonator which makes use of bulk longitudinal acoustic waves in a thin piezoelectric (PZ) film sandwiched between two metal electrodes.

The PZ film sandwiched between the electrodes is a resonator film which is preferably not fixed but suspended in the air. By so doing, when an elastic wave generated in the PZ film by converting electrical energy to mechanical vibration is confined in the PZ film, the elastic wave is propagated in the direction of an electric field and reflected at the interface between the electrodes and the air, thereby preventing attenuation of the mechanical vibration.

To obtain the resonator film suspended in the air, a through hole or a depression is formed in a substrate which supports the resonator film, or a depression is formed in a support layer which is formed between the substrate and the resonator film.

For example, the specification of U.S. Pat. No. 6,384,697 discloses a resonator including a bottom electrode, a PZ film and a top electrode formed in this order on a substrate to cover a cavity formed in the substrate. The specification also discloses a method of fabricating a resonator having a cavity by forming the cavity by etching a depression into the substrate, forming a sacrificial layer made of $SiO_2$, forming a bottom electrode, a PZ film and a top electrode in this order on the sacrificial layer formed on the substrate, forming an opening and removing the sacrificial layer via the opening by etching.

Further, Japanese Unexamined Patent Publication No. 2002-509644 (corresponding to International Application WO98/16956) discloses a method of fabricating FBARs by forming an insulating protective film, a bottom electrode, a PZ film and a top electrode on a substrate in this order so that a via hole formed in the substrate is covered. The Publication further discloses the steps of forming a sacrificial layer on a selected portion of the substrate, forming an insulating protective film, a bottom electrode, a PZ film and a top electrode in this order on the sacrificial layer, forming a via hole in the selected portion of the substrate and removing the sacrificial layer through the via hole by etching.

Japanese Unexamined Patent Publication No. H9-64675 discloses a resonator including a bottom electrode, a PZ film and a top electrode formed on a $SiO_2$ layer which is formed on a substrate to cover a cavity formed in the substrate. According to the Publication, the resonator is formed by the steps of forming a cavity in the substrate by etching, bonding the $SiO_2$ layer to the substrate in which the cavity has been formed and stacking the bottom electrode, PZ film and top electrode in this order on the $SiO_2$ layer.

In the thus configured resonator, the cavity is provided below a resonator film including the bottom electrode, the PZ film and the top electrode. Therefore, an elastic wave generated in the resonator film is confined in the resonator film with efficiency.

In a resonator of a conventional structure, however, the cavity exists only below part of the resonator film where electrical resonance occurs and a support member for supporting the resonator film is provided below other parts of the resonator film, thereby hindering vibration of the resonator film.

To meet the requirements for the filters such as broadband and low loss, it is necessary to increase the difference ($\Delta f$) between resonant frequency and antiresonant frequency of the resonator of the FBAR and to raise a selectivity value (Q). To obtain a large $\Delta f$, the resonator film needs to vibrate without restraint. When the resonator film is suspended in the air in the absence of the support, the value $\Delta f$ will be the largest. However, since a certain structure for supporting the resonator film is indispensable in reality, it is preferable that the resonator film vibrates as freely as possible.

A filter is formed of two or more FBARs arranged adjacent to each other. Therefore, if the adjacent FBARs are supported by the supports contacting each other, the vibration of one of the FBARs is transmitted to the other via the contacting supports, thereby causing unwanted resonance (spurious vibration) and a decrease in $\Delta f$.

SUMMARY OF THE INVENTION

To solve the above-described problems, the present invention intends to realize a high-performance bulk acoustic resonator which offers a large $\Delta f$ value without causing any spurious vibration and a filter using the same.

For that purpose, the present invention provides an acoustic resonator provided with an isolation cavity.

More specifically, the acoustic resonator of the present invention comprises: a substrate; a resonator film which is supported above the main surface of the substrate and includes a piezoelectric film and a pair of a top electrode and a bottom electrode which are formed on part of the top surface and part of the bottom surface of the piezoelectric film, respectively, to face each other via the piezoelectric film; and a support which is formed on the main surface of the substrate to support the resonator film from below, the support being so formed that a resonance cavity is provided in part of a region between the substrate and the resonator film below at least a portion of part of the resonator film where the top electrode and the bottom electrode coincide with each other and an isolation cavity is provided in other part of said region where the support and the resonance cavity do not exist.

As to the acoustic resonator of the present invention, the support is so formed that the isolation cavity is provided in part of the region between the substrate and the resonator film where the support and the resonance cavity do not exist. Therefore, the degree of limitation on the vibration of the resonator film by the support is minimized. Further, transmission of unwanted vibration via the support is also prevented. Therefore, the acoustic resonator is obtained with a large Δf value and reduced spurious vibration.

As to the acoustic resonator of the present invention, it is preferred that the bottom electrode is formed on the middle part of the piezoelectric film and the support is formed between part of the resonator film where the bottom electrode has been formed and the substrate. By so doing, the isolation cavity is surely provided.

As to the acoustic resonator of the present invention, at least one of the ends of the bottom electrode is preferably spaced 1 μm or more from the corresponding end of the resonator film. With this configuration, the isolation cavity is surely provided.

As to the acoustic resonator of the present invention, the resonance cavity is preferably enclosed with the support. By so doing, the resonance cavity is sealed, thereby preventing oxidation of the bottom electrode. As a result, the acoustic resonator is obtained with high reliability.

In this case, the resonance cavity is preferably filled with inert gas and the inert gas is preferably helium gas or nitrogen gas. This allows preventing the oxidation of the bottom electrode with reliability.

As to the acoustic resonator of the present invention, the resonance cavity preferably communicates with outside. The resonance cavity may be surrounded by the support from three sides. Or alternatively, the resonance cavity may be enclosed with the support and the resonator film or the substrate may be provided with a through hole through which the resonance cavity communicates with outside. With this configuration, gas will not sealed in the cavity and therefore the resonator film is prevented from deformation caused by thermal expansion of the gas in the cavity, thereby preventing variations in resonant frequency.

As to the acoustic resonator of the present invention, the support is preferably made of conductive material. This allows easy drawing-out of the electrodes. Further, the conductive material is preferably any one of gold, tin, lead, silver, copper and silicon or a stack of at least two of them. With use of these materials, the resonator film is supported with reliability.

As to the acoustic resonator of the present invention, an insulating film is preferably formed on part of the top surface of the substrate where the support does not exist. Further, part of the insulating film is preferably in contact with the bottom surface of the resonator film. With this configuration, the resonator is supported with higher reliability.

The filter of the present invention comprises two or more acoustic resonators, wherein each of the acoustic resonators comprises: a substrate; a resonator film which is supported above the main surface of the substrate and includes a piezoelectric film and a pair of a top electrode and a bottom electrode which are formed on part of the top surface and part of the bottom surface of the piezoelectric film, respectively, to face each other via the piezoelectric film; and a support which is formed on the main surface of the substrate to support the resonator film from below, the support being so formed that a resonance cavity is provided in part of a region between the substrate and the resonator film below at least a portion of part of the resonator film where the top electrode and the bottom electrode coincide with each other and an isolation cavity is provided in other part of said region where the support and the resonance cavity do not exist.

As to the filter of the present invention, the support is so formed that the isolation cavity is provided in part of the region between the substrate and the resonator film where the support and the resonance cavity do not exist. Therefore, the degree of limitation on the vibration of the resonator film by the support is minimized. Further, vibration of one of the adjacent pair of the resonators is not transmitted to the other via the support, thereby preventing the occurrence of unwanted vibration. Therefore, the acoustic resonator is obtained with a large Δf value and reduced spurious vibration.

In the filter of the present invention, it is preferred that the acoustic resonators are integrally formed. This allows reduction in filter size.

Each of the isolation cavities is preferably formed at a boundary between an adjacent pair of the acoustic resonators. By so doing, the occurrence of unwanted vibration transmission between the acoustic resonators forming the filter is surely prevented.

As to the filter of the present invention, at least one of the resonator cavities is preferably enclosed with the support. This configuration prevents oxidation of the bottom electrodes, thereby improving reliability of the filter.

In this case, the at least one of the cavities enclosed with the support is preferably filled with inert gas and the inert gas is preferably helium gas or nitrogen gas. By so doing, the oxidation of the bottom electrodes is surely prevented.

As to the filter of the present invention, the substrate or the resonator film is provided with a through hole through which said at least one of the resonance cavities enclosed with the support communicates with outside. With this configuration, gas will not sealed in the cavities and therefore the resonator film is prevented from deformation caused by thermal expansion of the gas in the cavities, thereby preventing variations in resonant frequency.

As to the filter of the present invention, at least an adjacent pair of the resonance cavities may communicate with each other and the adjacent pair of the resonance cavities may be enclosed with the support.

As to the filter of the present invention, the support is preferably formed below the bottom electrodes to contact both of the bottom electrodes. By so doing, the structure of the support is simplified.

As to the filter of the present invention, the support is preferably made of conductive material. This allows easy drawing-out of the electrodes.

As to the filter of the present invention, the conductive material is preferably any one of gold, tin, lead, silver, copper and silicon or a stack of at least two of them. Use of these materials allows easy formation of the support which surely supports the resonator film.

As to the filter of the present invention, an insulating film is preferably formed on part of the top surface of the substrate where the support does not exist. Further, at least part of the insulating film is preferably in contact with the bottom surface of the resonator film. With this configuration, the resonator film is supported with reliability.

DETAILED DESCRIPTION OF THE INVENTION

Embodiment 1

Figure 1A:
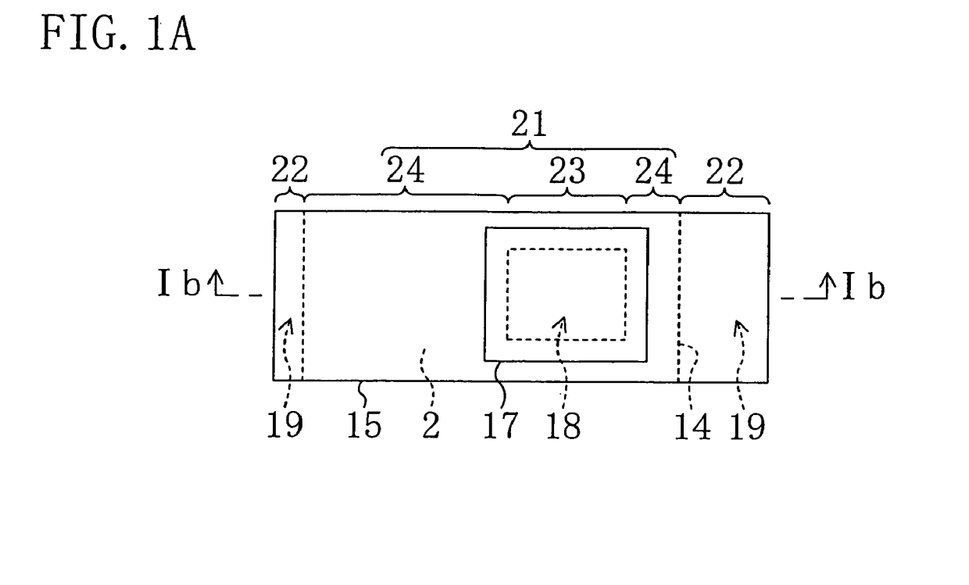
FIG. 1A is a schematic plan view illustrating an acoustic resonator of Embodiment 1 and FIG. 1B is a schematic sectional view taken along the line Ib-Ib shown in FIG. 1A.
Figure 1B:
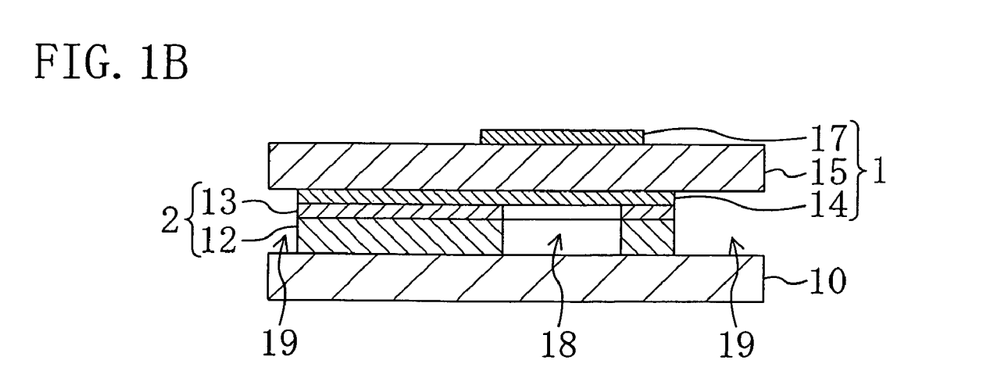

FIG. 1A is a plan view illustrating the structure of an acoustic resonator according to Embodiment 1 of the present invention. FIG. 1B is a sectional view taken along the line Ib-Ib shown in FIG. 1A. As shown in FIG. 1B, the acoustic resonator of this embodiment includes a resonator film 1 which is supported on a silicon semiconductor substrate 10 with a support 2 interposed therebetween.

The resonator film 1 is formed of a 0.5 µm thick piezoelectric (PZ) film 15 made of aluminum nitride (AlN) and a pair of a top electrode 17 and a bottom electrode 14 which are 0.6 µm thick molybdenum (Mo) films and formed on corresponding parts of the top surface and the bottom surface of the piezoelectric film 15, respectively, to face each other via the piezoelectric film 15.

Part of the resonator film 1 where the bottom electrode 14 or the top electrode 17 is formed is defined as a resonance region 21 in which the piezoelectric film 15 vibrates. On the other hand, part of the resonator film 1 where neither the bottom electrode 14 nor the top electrode 17 is formed is defined as an antiresonance region 22 in which the piezoelectric film 15 does not vibrate.

Part of the resonance region 21 where both of the top and bottom electrodes 17 and 14 are formed and a cavity 18 is formed below the electrodes is defined as an electrical and mechanical resonance part 23 in which an elastic wave generated in the piezoelectric film 15 is confined. Other part of the resonance region 21 than the electrical and mechanical resonance part 23 is supported on the semiconductor substrate 10 with the support 2 interposed therebetween and defined as a mechanical resonance part 24 in which the resonator film 1 mechanically vibrates.

The support 2 is formed of a layered structure of a 1.0 µm thick conductive support film 12 made of gold (Au) or a mixture thereof and a 0.2 µm thick contact electrode 13 made of Au. The bottom surface of the conductive support film 12 is in contact with the top surface of the semiconductor substrate 10, while the top surface of the contact electrode 13 is in contact with the bottom electrode 14.

An isolation cavity 19 is provided below the antiresonance region 22 so that the antiresonance region 22 is acoustically insulated from the semiconductor substrate 10. Therefore, the antiresonance region 22 is prevented from vibrating together with the resonance region 21, i.e., transmission of vibration is prevented. That is, since undesired vibration does not occur, an acoustic resonator is obtained with a large difference between resonant frequency and antiresonant frequency (Δf) and reduced spurious vibration.

As shown in FIG. 1A, the support 2 is in the form of a rectangular frame when viewed in plan such that the support 2 encloses the resonance cavity 18. Therefore, the resonance cavity 18 is cut off from ambient air. This configuration prevents oxidation of the exposed part of the bottom electrode 14, improving reliability of the acoustic resonator.

Figure 2A:
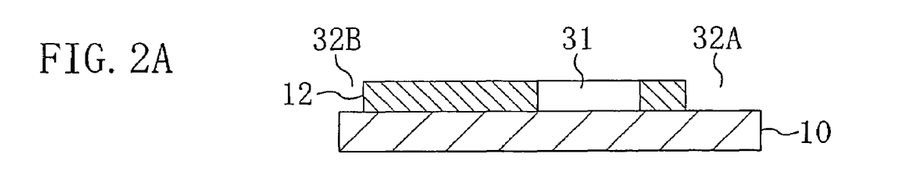
FIGS. 2A to 2F are sectional views sequentially illustrating the steps of fabricating the acoustic resonator of Embodiment 1.
Figure 2B:
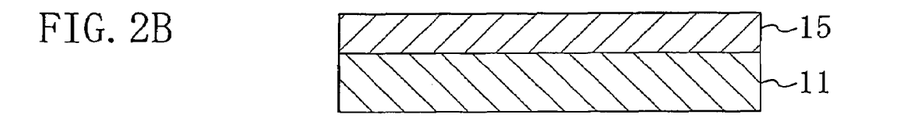

Hereinafter, an explanation is given of an example of a method for fabricating the acoustic resonator of Embodiment 1. FIGS. 2A to 2F shows the cross sections of the acoustic resonator of Embodiment 1 in the order of the fabrication steps. As shown in FIG. 2A, a 1.0 µm thick conductive film made of gold (Au) or a mixture thereof is formed by vapor deposition on a silicon semiconductor substrate 10 with an oxide film formed thereon, and subjected to lift-off to form a first depression 31, a second depression 32A and a third depression 32B, thereby obtaining a conductive support film 12. Then, as shown in FIG. 2B, a 0.5 µm thick piezoelectric film 15 made of AlN is epitaxially grown on a silicon carbide (SiC) substrate 11 on which a gallium nitride (GaN) buffer layer has been formed.

Figure 2C:
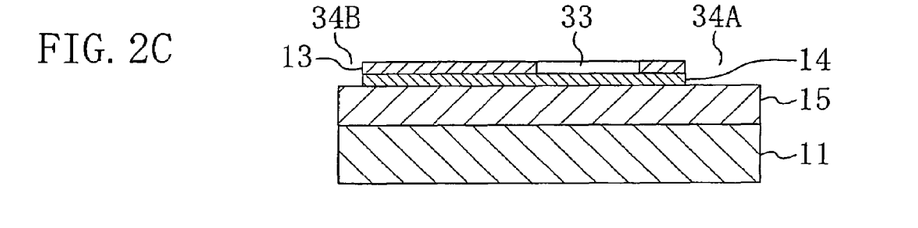

Then, as shown in FIG. 2C, a 0.6 µm thick bottom electrode 14 made of Mo is formed on a certain part of the surface of the piezoelectric film 15 by a known method. The length of the bottom electrode 14 is shorter than that of the piezoelectric film 15 by 1 µm or more so that a fifth depression 34A is surely provided. Subsequently, an Au film of 0.2 µm thick is formed by vapor deposition and shaped into a contact electrode 13 by lift-off. Thus, a fourth depression 33, a fifth depression 34A and a sixth depression 34B are formed at positions corresponding to the first depression 31, the second depression 32A and the third depression 32B, respectively.

Figure 2D:
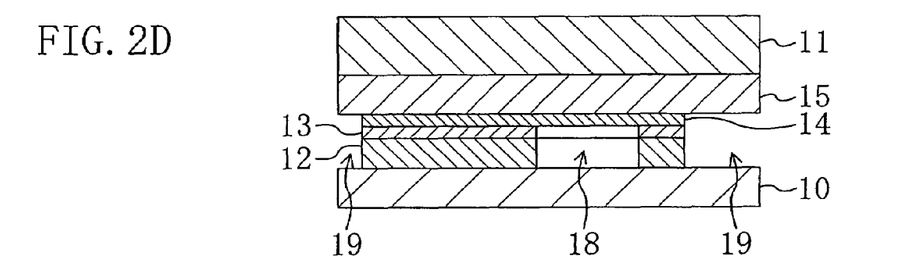

Then, as shown in FIG. 2D, the conductive support film 12 formed above the semiconductor substrate 10 and the contact electrode 13 formed above the substrate 11 are brought into close contact and heated at 375° C. for 10 minutes to bond the conductive support film 12 and the contact electrode 13 together, thereby obtaining the support 2.

Figure 2E:
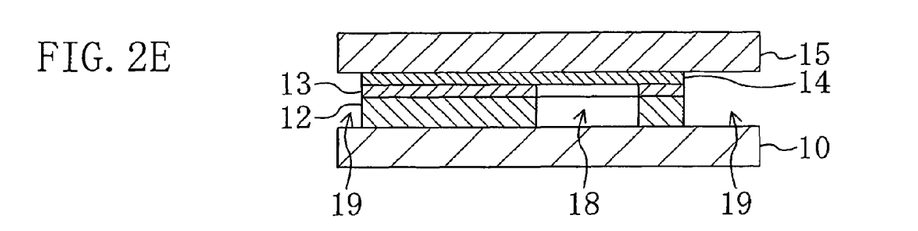
Figure 2F:
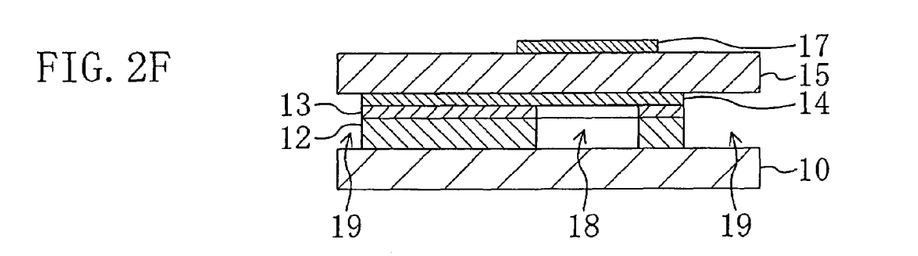

Further, as shown in FIG. 2E, the substrate 11 is peeled off the conductive film 15 by a known laser lift-off method. Then, a top electrode 17 made of Mo is formed on the piezoelectric film 15 by a known method, thereby completing an acoustic resonator as shown in FIG. 2F.

In this way, the acoustic resonator provided with the resonance cavity 18 and the isolation cavities 19 is easily formed by bonding and laser lift-off.

The thus obtained acoustic resonator showed a resonant frequency of about 1.93 GHz and an antiresonant frequency of about 1.97 GHz. The value Δf of the obtained acoustic resonator increased by about 5% than that of an acoustic filter in which the isolation cavities 19 are not provided, the bottom electrode is formed over the entire bottom surface of the piezoelectric film 15 and the support is formed to contact every part of the resonator film except the electrical and mechanical resonance part 23.

The acoustic resonator of this embodiment showed the resonant frequency of 1.93 GHz. However, according to this embodiment, an acoustic resonator showing a resonant frequency of about 1 to 20 GHz can be formed in the same manner by changing the size of the resonator film 1 and the size of the resonance cavity 18.

In Embodiment 1, the atmosphere in the resonance cavity 18 is not particularly controlled. If inert gas such as nitrogen gas or helium gas is sealed therein, oxidation of the bottom electrode 14 is prevented completely.

Instead of aluminum nitride (AlN) used as material for the piezoelectric film 15, zinc oxide (ZnO) may be used. Further, molybdenum (Mo) used as material for the bottom and top electrodes 14 and 17 may be replaced with metal material having high acoustic impedance such as tungsten (W) and iridium or low resistance material such as aluminum (Al) and copper (Cu). Alternatively, the bottom electrode 14 and the top electrode 17 may be made of different materials. If stable metal material such as gold (Au) is used, oxidation of the electrodes is prevented, thereby improving the reliability of the acoustic resonator.

The conductive support film 12 and the contact electrode 13 for forming the support 2 are made of gold (Au). However, any material may be used as long as the material has a low electric resistance and allows easy bonding of the conductive support film 12 and the contact electrode 13. For example, they may be made of any material selected from gold (Au), tin (Sn), lead (Pb), silver (Ag), copper (Cu) and silicon (Si), or an alloy containing them.

Variation of Embodiment 1

Hereinafter, an explanation is given of the difference of Variation of Embodiment 1 from Embodiment 1.

Figure 3A:
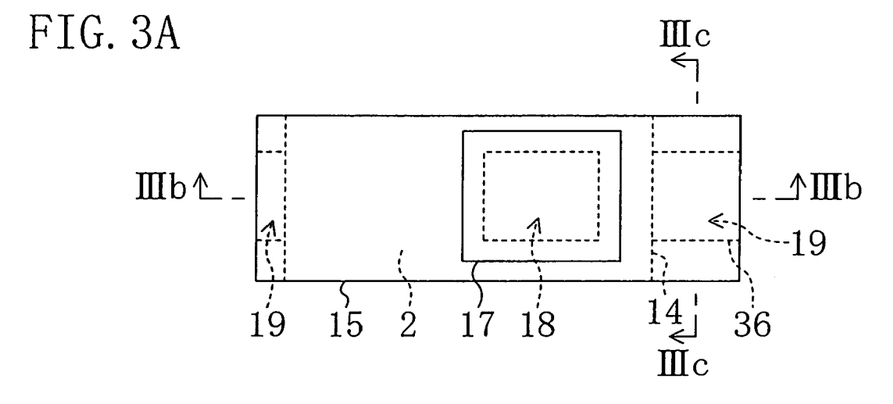
FIG. 3A is a schematic plan view illustrating a variation of the acoustic resonator of Embodiment 1 and FIGS. 3B and 3C are schematic sectional views taken along the lines IIIb-IIIb and IIIc-IIIc shown in FIG. 3A, respectively.
Figure 3B:
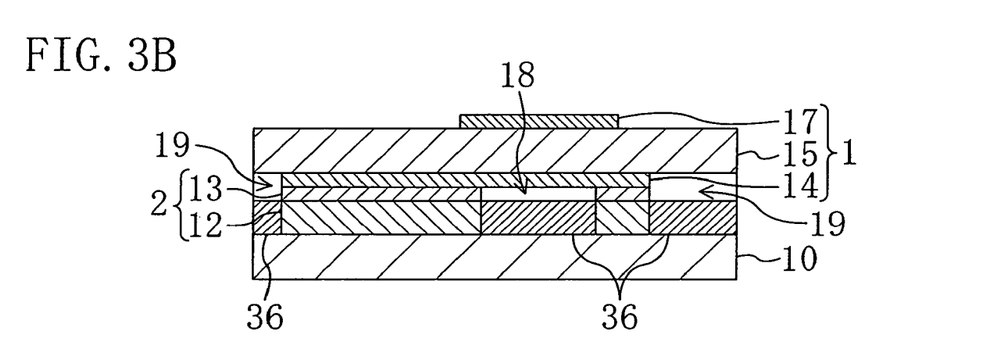
Figure 3C:
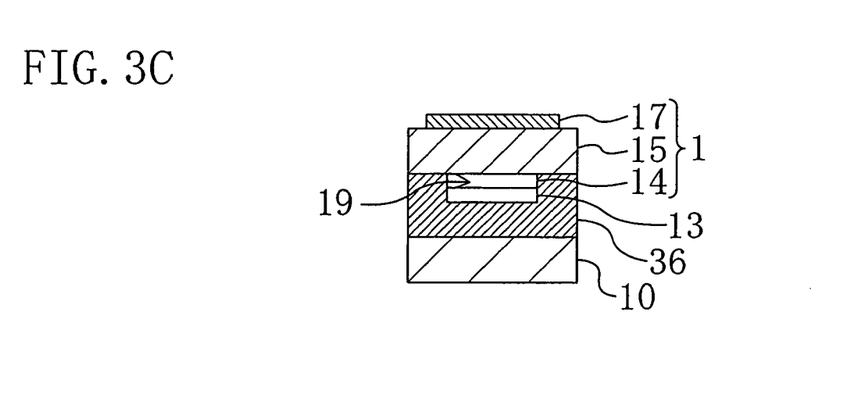

FIGS. 3A to 3C show the structure of an acoustic resonator according to this variation. FIG. 3A is a plan view and FIGS. 3B and 3C are sectional views taken along the lines IIIb-IIIb and IIIc-IIIc shown in FIG. 3A, respectively. As shown in FIGS. 3A to 3C, the acoustic resonator of this variation includes an insulating film 36 which is formed on part of the semiconductor substrate 10 where the support 2 does not exist and made of silicon oxide ($SiO_2$). Part of the insulating film 36 is in contact with part of the bottom surface of the piezoelectric film 15 in the antiresonance region 22 to support the resonator film 1 from below.

In the acoustic resonator of this variation, not only the support 2 but also the insulating film 36 supports the resonator film 1, thereby allowing an increase in area of the resonator film 1. Since the insulating film 36 is in contact with only part of the resonator film 1 in the antiresonance region 22, unwanted vibration does not occur in the antiresonance region 22. Therefore, transmission of vibration is prevented, thereby preventing a decrease in the value Δf and the occurrence of spurious vibration. If the area of the part of the insulating film 36 contacting the antiresonance region 22 of the resonator film 1 is not larger than 50% of the area of the antiresonance region 22, the transmission of vibration is prevented. The percentage is preferably not larger than 30%, more preferably not larger than 10%.

Instead of silicon oxide ($SiO_2$), silicon nitride (SiN) or silicon oxynitride (SiON) may be used as material for the insulating film 36.

Embodiment 2

Figure 4A:
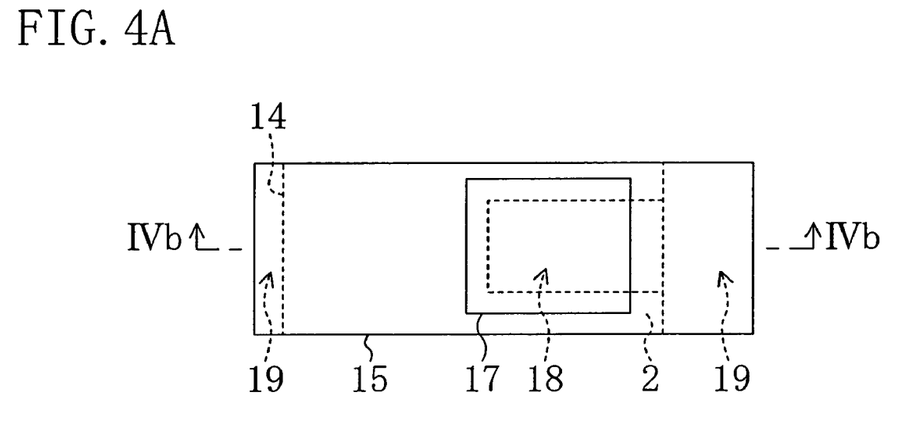
FIG. 4A is a schematic plan view illustrating an acoustic resonator of Embodiment 2 and FIG. 4B is a schematic sectional view taken along the line IVb-IVb shown in FIG. 4A.
Figure 4B:
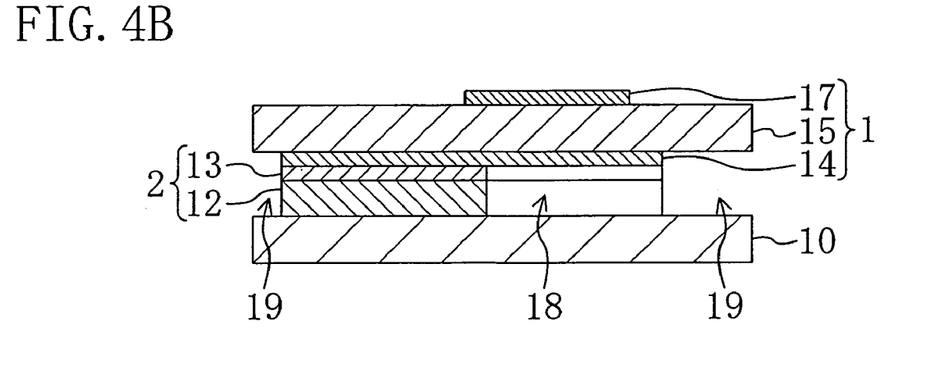

Hereinafter, with reference to the drawings, an explanation is given of an acoustic resonator according to Embodiment 2 of the present invention. FIGS. 4A and 4B illustrate the structure of the acoustic resonator of Embodiment 2. FIG. 4A is a plan view and FIG. 4B is a sectional view taken along the line IVb-IVb shown in FIG. 4A. In FIGS. 4A and 4B, the same components as those depicted in FIG. 1 are given with the same reference numerals and the explanation thereof is omitted.

Referring to FIGS. 4A and 4B, the acoustic resonator of Embodiment 2 includes a support 2 is substantially U-shaped. A cavity 18 is not enclosed with but surrounded by the support 2 from three sides with a one side opened. Since the resonance cavity 18 communicates with outside in this manner, gas is not sealed in the cavity 18, thereby preventing the resonator film 1 from deformation caused by thermal expansion of the gas in the cavity 18. This avoids variations in resonant frequency caused by heat.

In this embodiment, the support 2 is U-shaped so that the cavity 18 communicates with outside. When the support 2 is in the form of a rectangular frame as described in Embodiment 1, a through hole may be formed in the resonator film 1 or the semiconductor substrate 10 so that the cavity 18 communicates with outside via the through hole.

In the same manner as Variation of Embodiment 1, an insulating film may be formed on part of the semiconductor substrate 10 where the support 2 does not exist so that part of the antiresonance region 22 is supported by the insulating film.

Embodiment 3

Figure 5A:
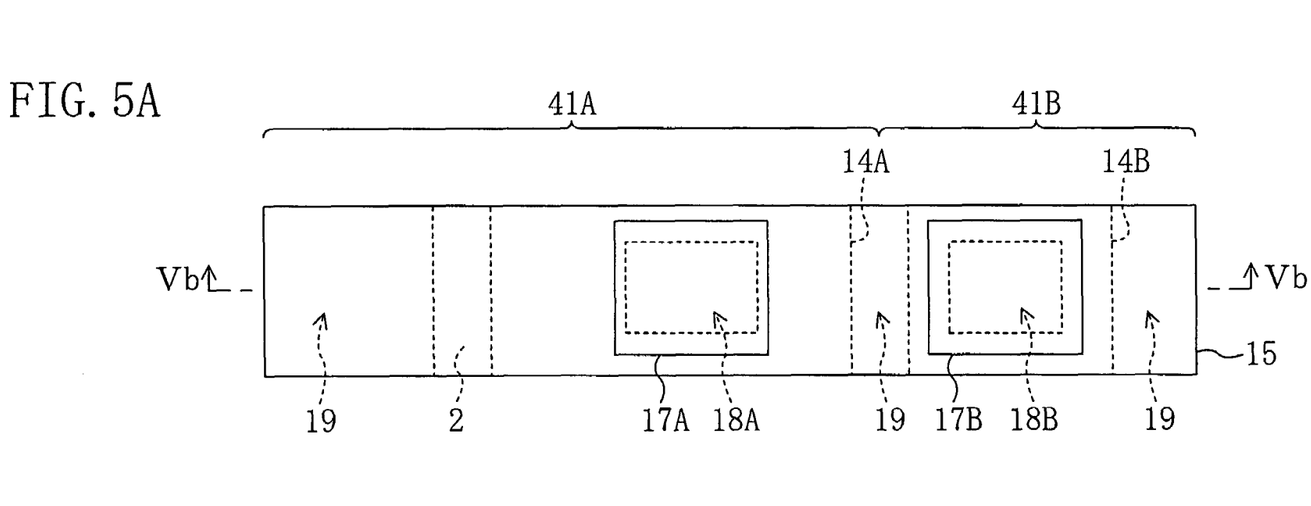
FIG. 5A is a schematic plan view illustrating a filter of Embodiment 3 and FIG. 5B is a schematic sectional view taken along the line Vb-Vb shown in FIG. 5A.
Figure 5B:
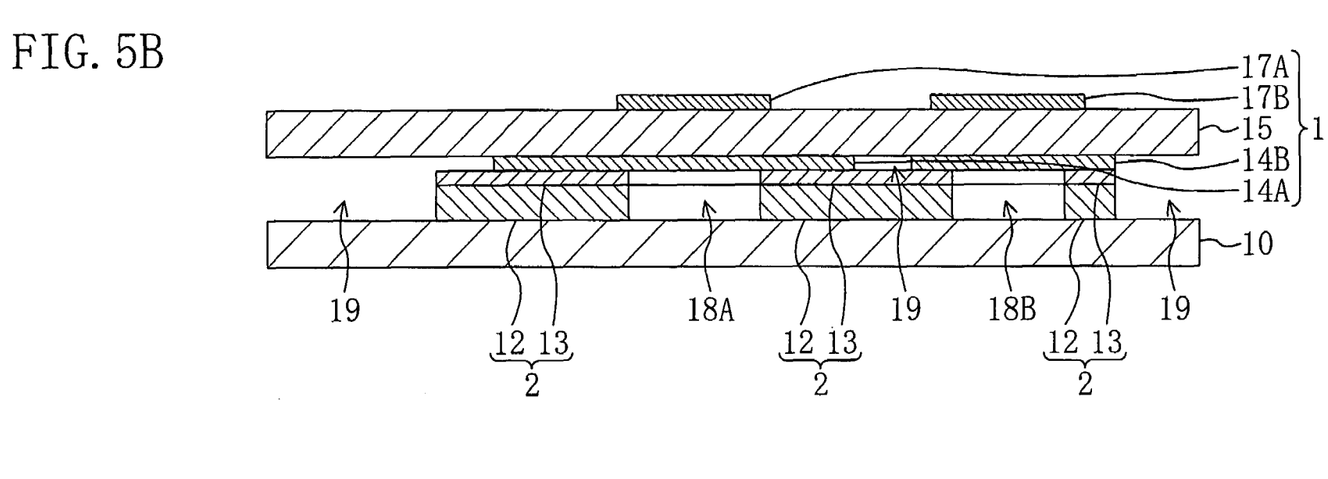

Hereinafter, with reference to the drawings, an explanation is given of Embodiment 3 of the present invention. FIGS. 5A and 5B illustrate the structure of a filter according to Embodiment 3 of the present invention. FIG. 5A is a plan view and FIG. 5B is a sectional view taken along the line Vb-Vb shown in FIG. 5A.

As shown in FIGS. 5A and 5B, the filter of this embodiment includes a first acoustic resonator 41A and a second acoustic resonator 41B which are integrally formed. A first top electrode 17A and a first bottom electrode 17A are formed in pairs on parts of the surfaces of a piezoelectric film 15 to face each other via the piezoelectric film 15, and so are a second top electrode 17B and a second bottom electrode 17B. Thus, a resonator film 1 including two resonance regions is provided. The resonator film 1 is supported on a semiconductor substrate 10 with a support 2 interposed therebetween to form the first and second acoustic resonators 41A and 41B.

With the presence of isolation cavities 19 at both ends of the filter, transmission of vibration from the first and second acoustic resonators 41A and 41B to adjacent filters is prevented. Further, an isolation cavity 19 provided between the first and second acoustic resonators 41A and 41B prevents transmission of vibration between the first and second acoustic resonators 41A and 41B. This allows obtaining a broadband filter without any spurious vibration.

Where the center frequency of the filter of this embodiment was set to about 2 GHz, a pass band width of the filter was about 40 MHz. That is, the pass band width increased by about 10% as compared with a filter not provided with the isolation cavities 19.

Figure 6A:
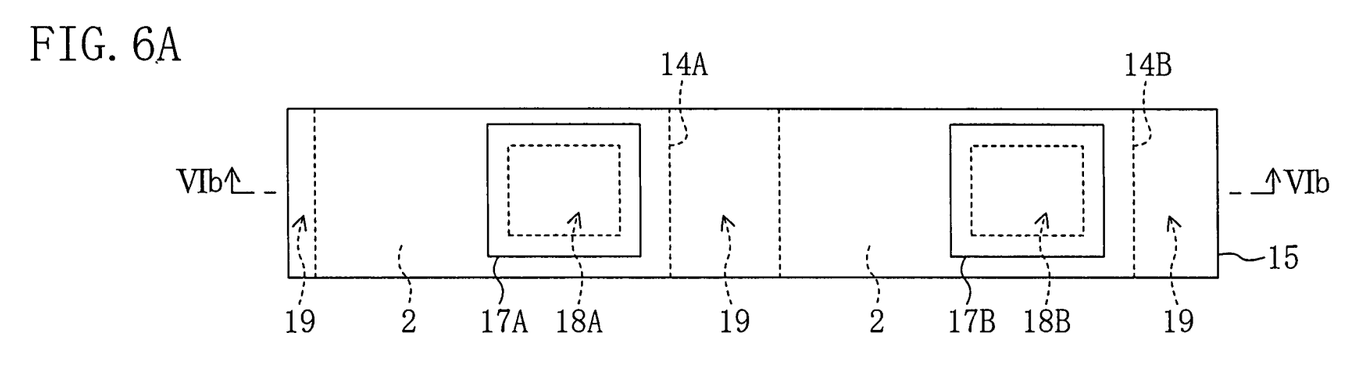
FIG. 6A is a schematic plan view illustrating an example of the filter of Embodiment 3 and FIG. 6B is a schematic sectional view taken along the line VIb-VIb shown in FIG. 6A.
Figure 6B:
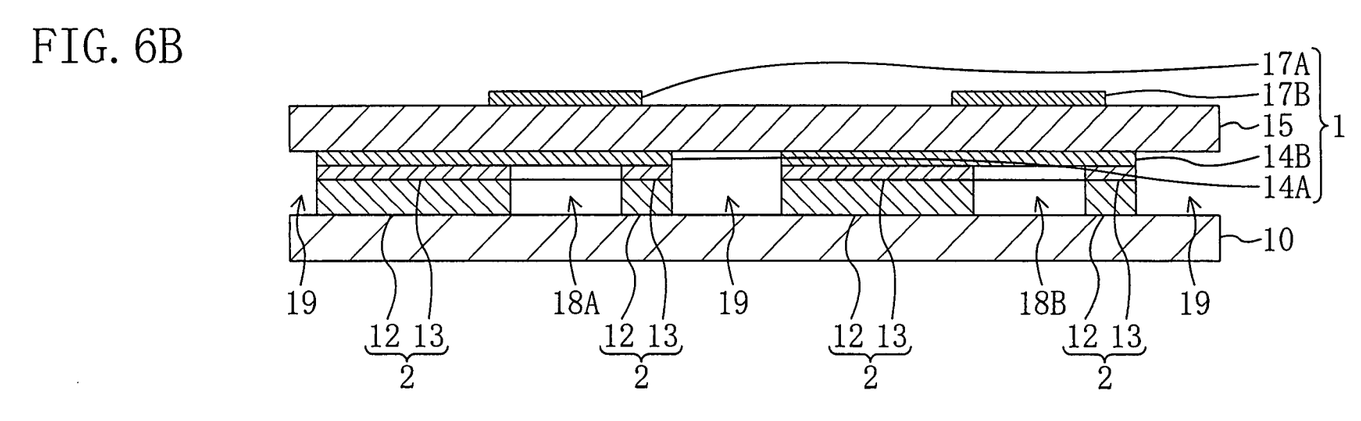

In this embodiment, the support 2 is formed to contact both of the first and second bottom electrodes 14A and 14B from below to simplify the formation of the support 2. However, separate supports 2 may be provided below the electrodes, respectively. Further, various kinds of acoustic resonators may be combined without limitation. For example, if two acoustic resonators of Embodiment 1 are combined as shown in FIGS. 6A and 6B, oxidation of the first and second bottom electrodes 14A and 14B is prevented because a first resonance cavity 18A and a second resonance cavity 18B are enclosed.

Figure 7A:
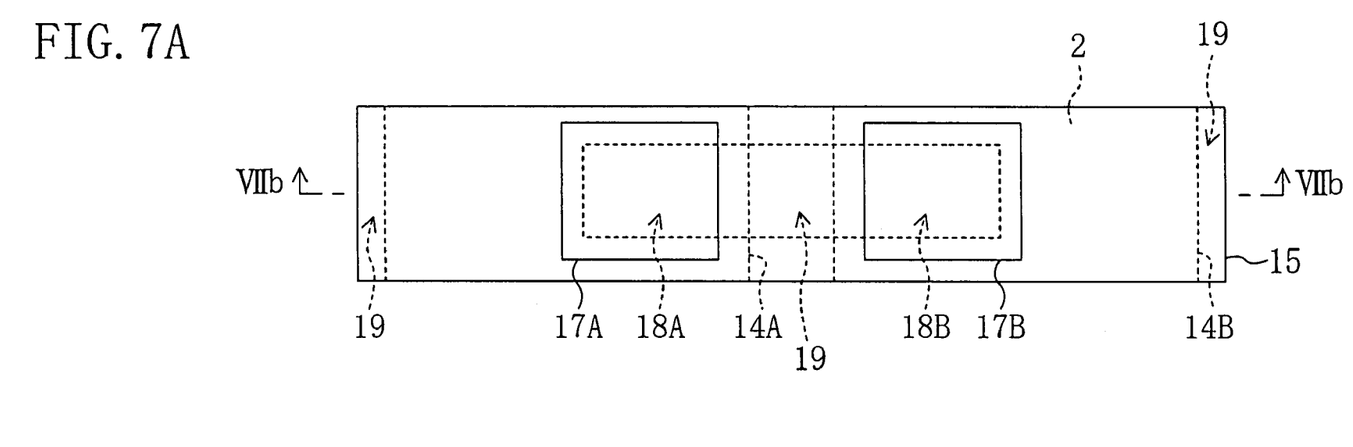
FIG. 7A is a schematic plan view illustrating an example of the filter of Embodiment 3 and FIG. 7B is a schematic sectional view taken along the line VIIb-VIIb shown in FIG. 7A.
Figure 7B:
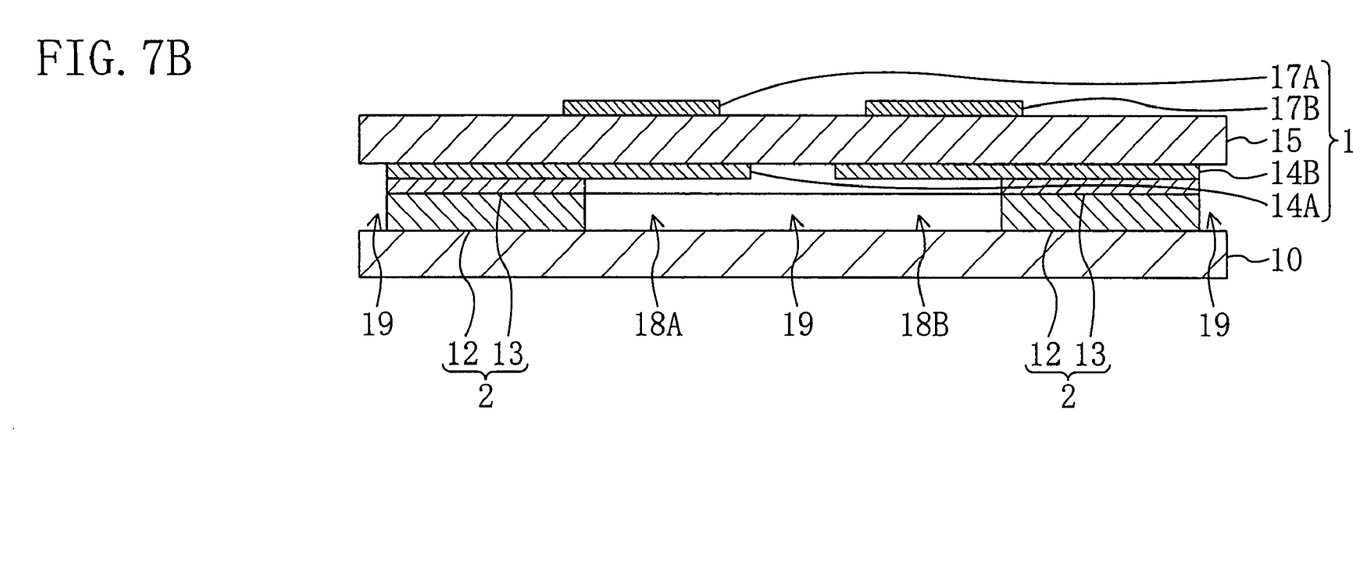

The acoustic resonators of Embodiment 2 may be combined as shown in FIGS. 7A and 7B. In this case, an additional support is formed in the isolation cavity 19 between the combined acoustic resonators. By so doing, the U-shaped supports 2 are connected so that a first resonance cavity 18A and a second resonance cavity 18B communicate with each other to provide a large enclosed cavity. With the thus obtained large cavity, the area occupied by the support 2 is reduced, thereby decreasing the chip size. Further, since the cavity is enclosed to prevent oxidation of the bottom electrodes, a reliable, temperature-compensating filter is obtained.

Figure 8A:
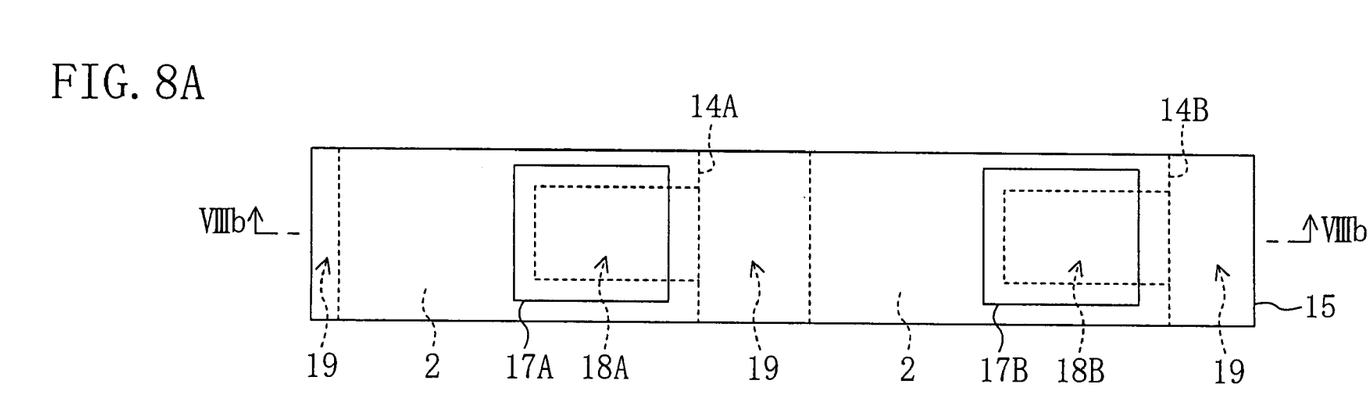
FIG. 8A is a schematic plan view illustrating an example of the filter of Embodiment 3 and FIG. 8B is a schematic sectional view taken along the line VIIIb-VIIIb shown in FIG. 8A.
Figure 8B:
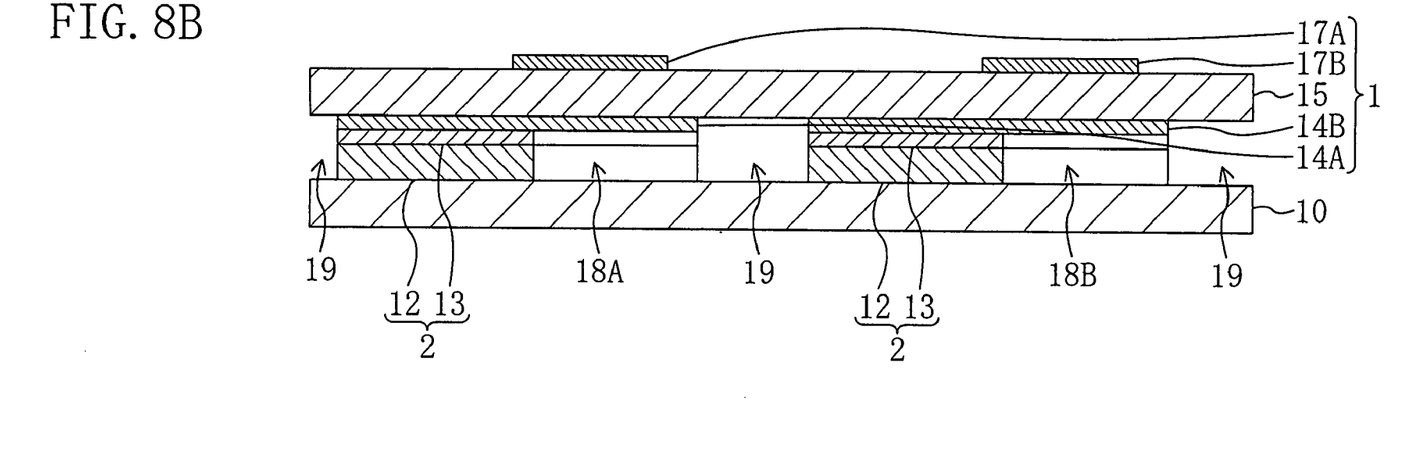

If the acoustic resonators of Embodiment 2 are combined as shown in FIGS. 8A and 8B, a first resonance cavity 18A, a second resonance cavity 18B and the isolation cavities 19 communicate with outside. Therefore, thermal expansion of gas in the cavities and the resulting deformation of the cavities do not occur, thereby preventing variations in resonant frequency.

The filter described in this embodiment is formed of a combination of two acoustic resonators. However, the filter may be formed of a combination of three or more acoustic resonators. In this case, desired acoustic resonators may be combined. Further, as in Variation of Embodiment 1 described above, the filter may be formed of acoustic resonators in each of which an insulating film is formed on part of the substrate where the support does not exist.

Among the resonance cavities and the isolation cavities, the sealed ones may be filled with inert gas such as helium gas or nitrogen gas so that oxidation of the bottom electrodes is prevented more reliably. This allows obtaining a highly reliable filter.

If a through hole is formed in part of the substrate or the resonator film so that the resonator cavity and the isolation cavity communicate with outside, thermal expansion of gas in the cavities and the resulting deformation of the cavities do not occur, thereby preventing variations in resonant frequency.

As described above, the acoustic resonator and the filter of the present invention allows realizing a high performance bulk acoustic resonator which offers a large difference between resonant frequency and antiresonant frequency and does not cause spurious vibration, as well as a filter using the acoustic resonator. Thus, the present invention is useful for thin film bulk acoustic resonators and filters for use in electronic circuits.

What is claimed is:

1. An acoustic resonator comprising:
    a substrate;
    a resonator film which is supported above the main surface of the substrate and includes a piezoelectric film and a pair of a top electrode and a bottom electrode which are formed on part of the top surface and part of the bottom surface of the piezoelectric film, respectively, to face each other via the piezoelectric film; and
    a support which is formed on the main surface of the substrate to support the resonator film from below, the support being so formed that a resonance cavity is provided in part of a region between the substrate and the resonator film below at least a portion of part of the resonator film where the top electrode and the bottom electrode coincide with each other and an isolation cavity is provided in other part of said region where the support and the resonance cavity do not exist,
    wherein the resonance cavity is enclosed by the support, and the resonance cavity is filled with inert gas.

2. An acoustic resonator according to claim 1, wherein
    the bottom electrode is formed on the middle part of the piezoelectric film and
    the support is formed between part of the resonator film where the bottom electrode has been formed and the substrate.

3. An acoustic resonator according to claim 1, wherein at least one of the ends of the bottom electrode is spaced 1 μm or more from the corresponding end of the resonator film.

4. An acoustic resonator according to claim 1, wherein the inert gas is helium gas or nitrogen gas.

5. An acoustic resonator according to claim 1, wherein the support is made of conductive material.

6. An acoustic resonator according to claim 5, wherein the conductive material is any one of gold, tin, lead, silver, copper and silicon or a stack of at least two of them.

7. An acoustic resonator according to claim 1, wherein an insulating film is formed on part of the top surface of the substrate where the support does not exist.

8. An acoustic resonator according to claim 7, wherein part of the insulating film is in contact with the bottom surface of the resonator film.

9. A filter comprising two or more acoustic resonators, wherein each of the acoustic resonators comprises:
    a substrate;
    a resonator film which is supported above the main surface of the substrate and includes a piezoelectric film and a pair of a top electrode and a bottom electrode which are formed on part of the top surface and part of the bottom surface of the piezoelectric film, respectively, to face each other via the piezoelectric film; and
    a support which is formed on the main surface of the substrate to support the resonator film from below, the support being so formed that a resonance cavity is provided in part of a region between the substrate and the resonator film below at least a portion of part of the resonator film where the top electrode and the bottom electrode coincide with each other and an isolation cavity is provided in other part of said region where the support and the resonance cavity do not exist,
    wherein at least one of the resonance cavities of the at least two or more acoustic resonators is enclosed by the support, and said at least one of the resonance cavities of the at least two or more acoustic resonators enclosed by the support is filled with inert gas.

10. A filter according to claim 9, wherein the acoustic resonators are integrally formed.

11. A filter according to claim 9, wherein each of the isolation cavities of the at least two or more acoustic resonators is formed at a boundary between an adjacent pair of the acoustic resonators.

12. A filter according to claim 9, wherein the inert gas is helium gas or nitrogen gas.

13. A filter according to claim 9, wherein
    at least an adjacent pair of the resonance cavities of the at least two or more acoustic resonators communicate with each other and
    the adjacent pair of the resonance cavities of the at least two or more acoustic resonators are enclosed by the support.

14. A filter according to claim 9, wherein the support is formed below the bottom electrodes to contact both of the bottom electrodes.

15. A filter according to claim 9, wherein the support is made of conductive material.

16. A filter according to claim 15, wherein the conductive material is any one of gold, tin, lead, silver, copper and silicon or a stack of at least two of them.

17. A filter according to claim 9, wherein an insulating film is formed on part of the top surface of the substrate where the support does not exist.

18. A filter according to claim 17, wherein at least part of the insulating film is in contact with the bottom surface of the resonator film.

* * * * *